United States Patent [19]

Albert

[11] Patent Number: 5,123,133
[45] Date of Patent: Jun. 23, 1992

[54] ORTHOPEDIC PILLOW WITH SPEAKERS

[76] Inventor: Chester Albert, Chemin Rivière-à-la-Truite, Saint-Jacques, Nouveau-Brunswick, Canada, E0L 1K0

[21] Appl. No.: 791,544

[22] Filed: Nov. 14, 1991

[30] Foreign Application Priority Data

Aug. 20, 1991 [CA] Canada ................................ 2049526

[51] Int. Cl.⁵ .................................................. A47G 9/00
[52] U.S. Cl. ............................................ 5/639; 5/904; 381/24; 381/188; 455/344
[58] Field of Search ......................... 5/434–442, 5/462, 448; 297/391, 397; 381/187, 188, 24; 455/344; D6/601

[56] References Cited

U.S. PATENT DOCUMENTS

| D. 320,523 | 10/1991 | Vinsant, Jr. | D6/601 |
|---|---|---|---|
| 2,958,769 | 11/1960 | Bounds | 5/442 |
| 2,962,731 | 12/1960 | Bounds | 5/442 |
| 3,156,500 | 4/1964 | Kerr | 297/391 |
| 3,946,316 | 3/1976 | Hough | 455/344 |
| 4,447,922 | 5/1984 | Brocmu | 297/391 |
| 4,777,855 | 10/1988 | Cohen | 5/434 |
| 4,991,222 | 2/1991 | Nixdorf | 381/188 |

Primary Examiner—Alexander Grosz
Attorney, Agent, or Firm—Swabey Ogilvy Renault

[57] ABSTRACT

A pillow comprises a horizontally extending body for supporting the head of a user of the pillow. The pillow also comprises a pair of leg members which extend transversely at opposite lateral ends of the body and downwardly from a lower surface thereof, thereby defining a space between the leg members and under the body. A pair of speakers are positioned in the body each at least partly above a respective leg member and in a way so that sound emitted thereby is directed substantially vertically when no load is applied on the pillow. The body being made of a flexible material, the resting of the user's head on an upper central portion of the body causes this central portion to deflect downwards with the leg members and the end portions of the body pivoting upwards and inwards in such a way that the speaker pivots with the body so that sound emitting therefrom is directed at an angle upwards and inwards towards the user's ears.

7 Claims, 3 Drawing Sheets

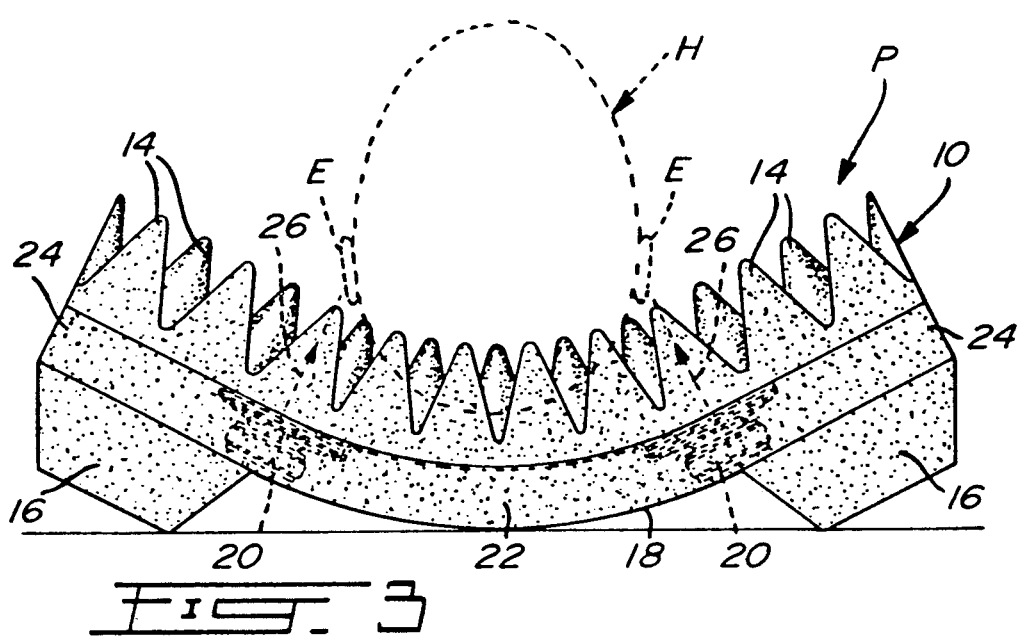
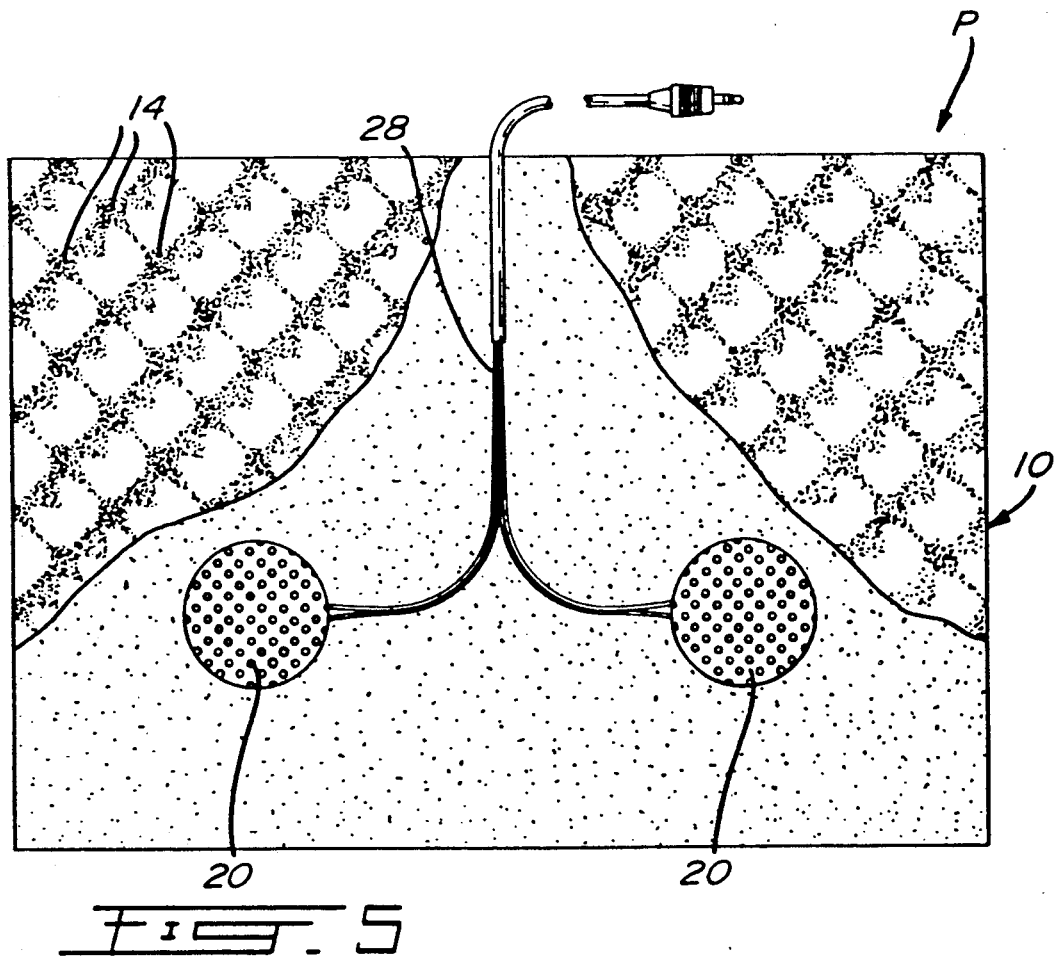

ORTHOPEDIC PILLOW WITH SPEAKERS

BACKGROUND OF THE INVENTION

1. Field of the Invention

The present invention relates to pillows and, more particularly, to an orthopedic pillow having speakers incorporated therein which are adapted to orient towards the user's head.

2. Description of the Prior Art

Prior art pillows include the pillow of U.S. Pat. No. 2,962,731 which issued on Dec. 6, 1960 to Bounds and which discloses a pillow defining therein a hollow core for storing objects such as small radios.

U.S. Pat. No. 2,958,769 issued on Nov. 1, 1960 also to Bounds discloses a combination pillow and radio which defines two holes for allowing access to the control knobs of a radio embedded therein.

SUMMARY OF THE INVENTION

It is therefore an aim of the present invention to provide a pillow which is orthopedic and which also provides a proper orientation of the speakers incorporated therein towards the user's ears.

Therefore, in accordance with the present invention, there is provided a pillow which comprises a horizontally extending body for supporting the head of a user of the pillow, a pair of leg means extending transversely at opposite lateral ends of the body and downwardly from a lower surface thereof. Therefore, a space is defined between the leg means and under the body. At least one speaker is positioned in the body so that sound emitted thereby is directed substantially vertically when no load is applied on the pillow. The body being made of a flexible material, whereby, when the head of the user rests on an upper central portion of the body, the body deflects downwardly at its central portion with the leg means and the end portions of the body pivoting upwards and inwards thereby causing the speaker to pivot therewith in order that sound emitted thereby is directed toward at least one of the user's ears.

BRIEF DESCRIPTION OF THE DRAWINGS

Having thus generally described the nature of the invention, reference will now be made to the accompanying drawings showing by way of illustration only a preferred embodiment of the present invention, and wherein:

FIG. 3 is a rear cross-sectional elevation view of the pillow with the user's head resting thereon;

FIG. 5 is a partly fragmented horizontal cross-section of the pillow of FIG. 1.

DESCRIPTION OF THE PREFERRED EMBODIMENTS

Figure 1:
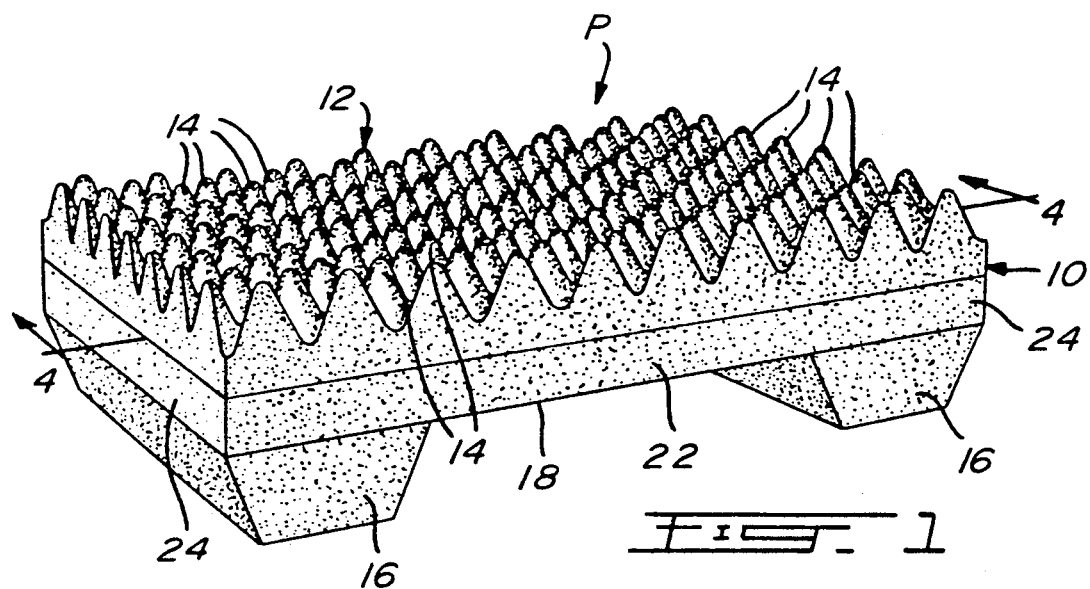
FIG. 1 is a perspective view of a pillow in accordance with the present invention.
Figure 2:
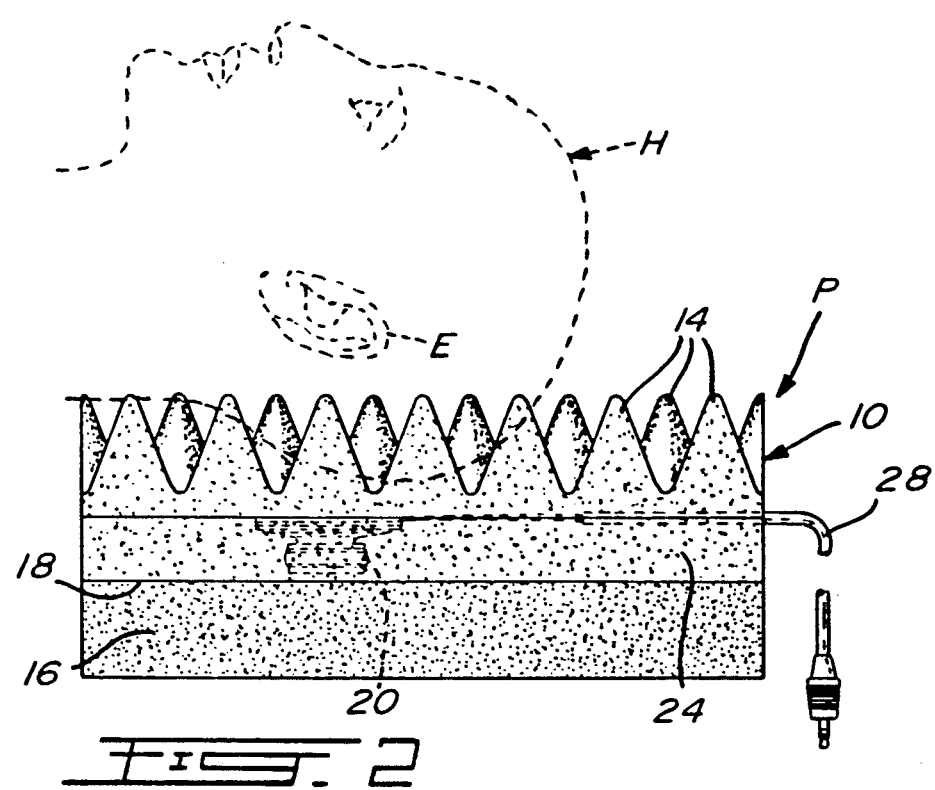
FIG. 2 is a cross-sectional side view of the pillow of FIG. 1, showing in phantom lines the user's head prior to it applying a load on the pillow.

FIG. 1 illustrates a pillow P in accordance with the present invention having a main body 10 of rectangular outline. The main body 10 has an upper surface 12 defining a series of adjacent rows of cone-shaped members or crests 14 of orthopedic configuration for allowing comfort and air circulation therethrough. The lower peripheral sides of each cone-shaped member 14 merges with adjacent cone-shaped members.

Figure 4:
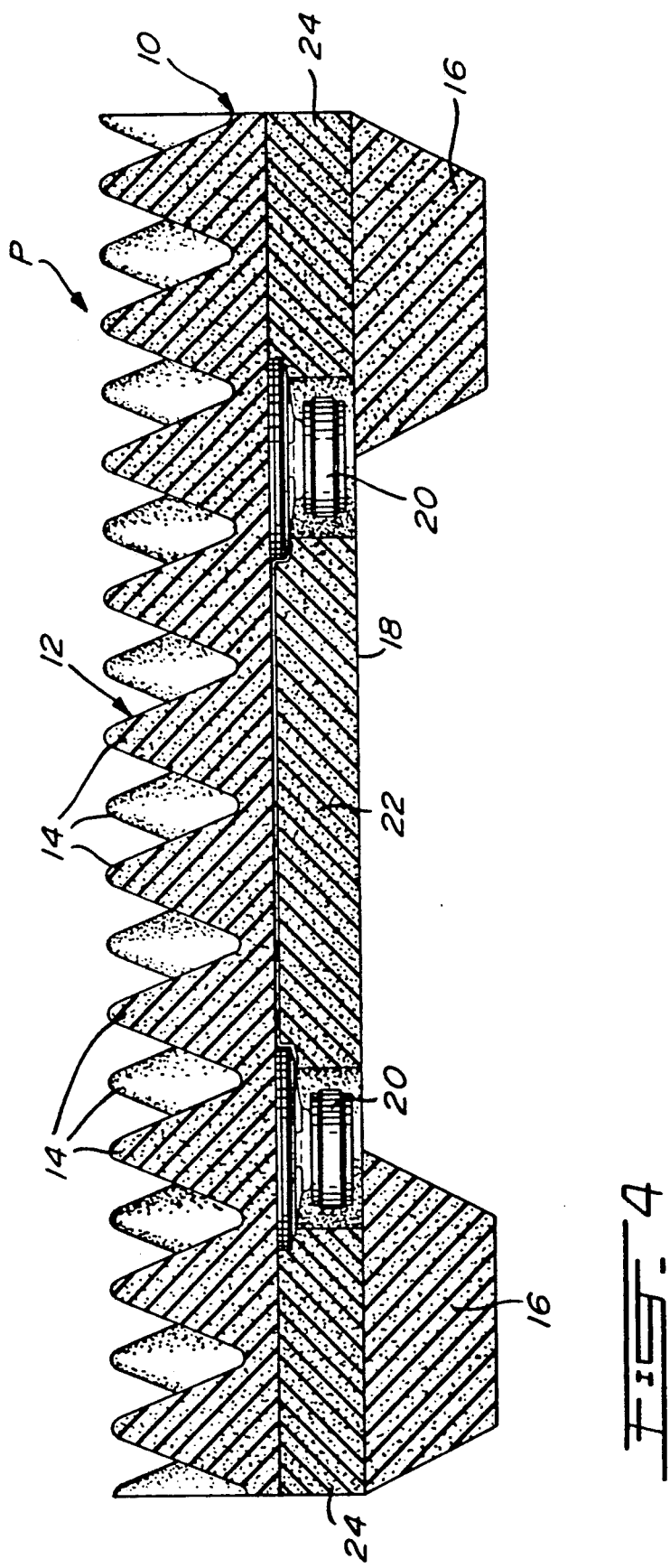
FIG. 4 is a longitudinal cross-sectional view of the pillow taken along lines 4—4 of FIG. 1.

A pair of leg supports 16 extend downwardly at opposite lateral ends of a lower surface 18 of the main body 10. Each leg support 16 has a cross-section shaped as an inverted isosceles trapezoid. As best seen in FIGS. 4 and 5, a pair of speakers 20 are incorporated in the body 10 slightly above and offset inwardly of respective leg supports 16. When no load is applied on the pillow P, sound emitting from the speakers 20 is directed substantially vertically.

As seen in FIG. 3, when the user's head H rests on the pillow P, a central portion 22 of the body 10 deflects downwardly as the end portions 24 thereof in concert with the leg supports 16 pivot upwardly and inwardly thereby causing a similar pivot of the speakers 22 to orient the same in such a way that sound emitted thereby becomes directed towards the ears E of the user's head H as indicated by arrows 26 of FIG. 3.

The main body 10 is made of two distinct layers extending the whole length of the pillow P. The top layer defines the crests 14 and has a flat lower surface which overlies the bottom layer of the main body 10. As best seen in FIG. 4, the bottom layer defines a pair of openings for receiving the speakers 20. Once the speakers 20 are positioned in their respective openings, the top layer and the leg supports 16 can be respectively mounted over and under the bottom layer and thus on each side of the speakers 20.

The above pillow construction is orthopedic as it ensures the comfort of the user's head due to the flexible material constituting the pillow P and due to the series of crests 14 which form the upper surface 12 of the main body 10 of the pillow P. Also, air circulation is ensured by the spaces defined between the crests 14.

The sounds emitted by the speakers 20 may be of relaxation nature, of teaching nature, subliminal, etc. The speakers 20 are obviously connected to a wire assembly 28.

The pivot of the end portions 24 of the body 10 along with that of the leg supports 16 ensure a proper orientation of the speakers with respect to the user's head H and, more particularly, the user's ears E.

I claim:

1. A pillow comprising a horizontally extending body for supporting the head of the user of the pillow, a pair of leg means extending transversely at opposite lateral ends of said body and downwardly from a lower surface thereof, whereby a space is defined between said leg means and under said body, at least one speaker being positioned in said body so that sound emitted thereby is directed substantially vertically when no load is applied on the pillow, said body being made of a flexible material, whereby, when the head of the user rests on an upper central portion of said body, said body deflects downwardly at said central portion with said leg means and end portions of said body pivoting upwards and inwards, the speaker being adapted to pivot with said body in order that sound emitted thereby is directed at an angle upwards and inwards towards at least one of the user's ears.

2. A pillow as defined in claim 1, wherein two speakers are provided in said body, one on each side of said central portion, whereby the deflection of said body under the user's head orients said speakers partly one towards the other and towards the user's head.

3. A pillow as defined in claim 2, wherein said speakers are each located near one end of said body and each at a location at least partly inwards of a respective one of said leg means.

4. A pillow as defined in claim 2, wherein said body comprises top and bottom layers, said bottom layer defining a pair of vertical openings for receiving said speakers and being located intermediate said top layer and said leg means, whereby said speakers are mounted between said top layer and at least part of said leg means.

5. A pillow as defined in claim 1, wherein each leg means defines an inner surface which tapers outwardly as it extends downwards from said lower surface of said body.

6. A pillow as defined in claim 5, wherein each leg means has a cross-section shaped as an inverted isosceles trapezoid, both leg means being parallel, said leg means each being adapted to pivot about an inner lower edge thereof.

7. A pillow as defined in claim 1, wherein an upper surface of said body defines series of adjacent rows of cone-shaped members of othopedic configuration.

* * * * *